(12) United States Patent
Wert

(10) Patent No.: US 6,271,703 B1
(45) Date of Patent: Aug. 7, 2001

(54) FAST OVERVOLTAGE PROTECTED PAD INPUT CIRCUIT

(75) Inventor: Joseph Douglas Wert, Arlington, TX (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 09/271,029

(22) Filed: Mar. 17, 1999

(51) Int. Cl.[7] .................................................. H03K 5/08
(52) U.S. Cl. ............................ 327/309; 327/318; 327/321
(58) Field of Search .................................. 327/318, 319, 327/309, 321, 327, 328, 310, 313, 330, 306, 333

(56) References Cited

U.S. PATENT DOCUMENTS

| | | | |
|---|---|---|---|
| 5,999,390 | * 12/1999 | Cho et al. | 361/86 |
| 6,066,973 | * 5/2000 | Sekino et al. | 327/313 |
| 6,069,515 | * 5/2000 | Singh | 327/309 |

* cited by examiner

Primary Examiner—Tuan T. Lam
Assistant Examiner—Hiep Nguyen
(74) Attorney, Agent, or Firm—Stallman & Pollock LLP

(57) ABSTRACT

An apparatus including an overvoltage protection circuit is provided that comprises an input terminal configured to convey an input voltage, an output terminal configured to convey an output voltage, a buffer circuit, coupled between the input terminal and the output terminal, configured to receive and buffer the input voltage and in accordance therewith provide the output voltage, and a voltage sensing circuit, coupled to the input terminal and the buffer circuit, configured to sense the input voltage and in accordance therewith maintain the buffer circuit in a predetermined voltage range.

20 Claims, 4 Drawing Sheets

FAST OVERVOLTAGE PROTECTED PAD INPUT CIRCUIT

TECHNICAL FIELD

This invention relates to input circuitry, and more specifically, to a fast input buffer circuit which protects deep sub-micron complementary metal-oxide semiconductor (CMOS) transistors from overvoltage stress.

BACKGROUND OF THE RELATED ART

Input circuits have been incorporated into chip technologies for many years to provide fast input buffers which protect deep sub-micron CMOS transistors from overvoltage stress.

Three such prior art input buffer circuits are shown in FIGS. 1A–C. The circuit 1 in FIG. 1A has two field effect transistors (FETs) 100a, 100b. Field effect transistor 100a is an n-type field effect transistor, whereas FET 100b is a p-type field effect transistor. An input pad 110 is connected to the drain terminal of FET 100a. The gate terminal of FET 100a is connected to voltage source $V_{DD}$. The source terminal of FET 100a is connected to a voltage restoring circuit 120, in the form of FET 100b having its gate and source terminals coupled through an inverter 130. The drain terminal of FET 100b is connected to a power supply $V_{DD}$. Further, two inverters 130 are connected in series and coupled to the source terminal of FET 100b.

A problem with the input circuit of FIG. 1A is that the voltage restoring circuit 120 conflicts with external pull-down resistors (not shown), which slow the speed and effectiveness of the circuit. The voltage restoring circuit 120 "pulls-up" the voltage to a "strong" HIGH logic level when FET 100b is switched ON. The large impedance of the external resistors (not shown) oppose the effectiveness of the voltage restoring circuit 120 to produce this "strong" HIGH logic level.

Another prior art input circuit is shown in FIG. 1B. The circuit 2 of FIG. 1B is composed of an input pad 110 connected to the drain terminal of FET 100a. The gate terminal of FET 100a is connected to a voltage source $V_{DD}$. The source terminal of FET 100a is connected to series connected inverters 130a, 130b, and output Y is generated.

This transistor 100a plays an important role in the operations of the circuit 2 of FIG. 1B. For example, if the transistor 100a was not included, then when the input pad 110 is powered up, e.g. to five volts, the gate-to-source voltage on the n-type FET (not shown) of the inverter 130a will be five volts and such n-type FET would pull the output of the inverter 130a to ground. This would cause the p-type FET (not shown) of the inverter 130a to have a gate-to-drain voltage of five volts. For deep submicron architecture neither of these results would be acceptable.

With the inclusion of FET 100a, however, the voltage at node A will never rise above the voltage on the gate terminal of FET 100a less its threshold drop (for DC conditions and long settling times, the threshold may be large). Therefore, the voltage at node A will be less than the internal voltage $V_{DD}$. Hence, the voltages across transistor 100a and the n-type and p-type FETs (not shown) of the inverter 130a are maintained in a range to achieve reasonable long-term reliability.

The circuit 2 of FIG. 1B does not have the conflict disadvantage characteristic of circuit 1 of FIG. 1A, however, it has the disadvantage of leaking DC current because the p-channel device (not shown) in inverter 130a is never completely turned off.

A third prior art input circuit is shown in FIG. 1C. The circuit 3 of FIG. 1C is composed of a pad input 110 connected to the drain terminal of FET 100a. The gate terminal of FET 100a is connected to a voltage source $V_{DD}$. The source terminal of FET 100a is connected to a CMOS inverter 140. This CMOS inverter 140 is composed of an n-type FET 100c and a p-type FET 100d.

The drain terminal of FET 100d is connected to a diode 120a, which is a p-type FET 100e, having its gate and source terminals coupled together. The drain of FET 100e is connected to a voltage source $V_{DD}$.

The output of the CMOS inverter 140 is connected to voltage restoring circuit 120, which is FET 100b having its gate and source terminals coupled through an inverter 130. The drain of FET 100b is connected to a voltage source $V_{DD}$. Further, another inverter 130 is coupled to the source terminal of FET 100b.

Although the circuit 3 in FIG. 1C avoids the disadvantages of the circuits shown in FIGS. 1A and 1B, the circuit 3 of FIG. 1C is slow. Furthermore, it also has a natural magnitude hysteresis. This hysteresis will slow down the AC performance, but for any input, the output results will consistently be the same.

Furthermore, to ensure threshold voltages and reasonable speeds, the sizes of p-type FETs 100d and 100e must be made large. The reason for the dimensional differences between the n-type and p-type FETs stems from the characteristic differences between the devices. The relationship between PMOS and NMOS transistors is such that for devices having the same dimensions, the current in a PMOS transistor is less than half of that in an NMOS device and the ON resistance of a p-channel MOSFET is nearly three times that for an n-channel MOSFET.

Both circuits 1 and 3 represented in FIGS. 1A and 1C inherently have a large amount of hysteresis (one-ended hysteresis). To meet the 0.8 volt "low" and two volt "high" thresholds (for 3.3 volt systems), the propagation times from low-to-high and from high-to-low will have a large amount of skew between them.

Alternatively, to achieve the same values of current and ON resistance as in an NMOS transistor, the channel width/length ratio must be increased to account for the lower hole mobility. This results in PMOS devices requiring nearly three times the area of an equivalent NMOS device.

It is thus desirable to provide a fast input buffer which protects deep sub-micron CMOS transistors from overvoltage stress with minimal DC power requirements.

Furthermore, it is desirable to provide a fast input buffer which protects deep sub-micron CMOS transistors from overvoltage stress which has no unusual bus loading and is faster than current I/O circuitry.

It is also desirable to provide a fast input buffer which protects deep sub-micron CMOS transistors from overvoltage stress which meets transistor-transistor logic (TTL) thresholds and has symmetrical response times for fast propagation times from LOW logic level to HIGH logic level ($T_{PLH}$) and from HIGH logic level to LOW logic level ($T_{PHL}$).

SUMMARY OF THE INVENTION

An apparatus including an overvoltage protection circuit is provided that comprises an input terminal configured to convey an input voltage, an output terminal configured to convey an output voltage, a buffer circuit, coupled between the input terminal and the output terminal, configured to receive and buffer the input voltage and in accordance therewith provide the output voltage, and a voltage sensing circuit, coupled to the input terminal and the buffer circuit, configured to sense the input voltage and in accordance therewith maintain the buffer circuit in a predetermined voltage range.

DETAILED DESCRIPTION OF THE PREFERRED EMBODIMENT

Figure 2:
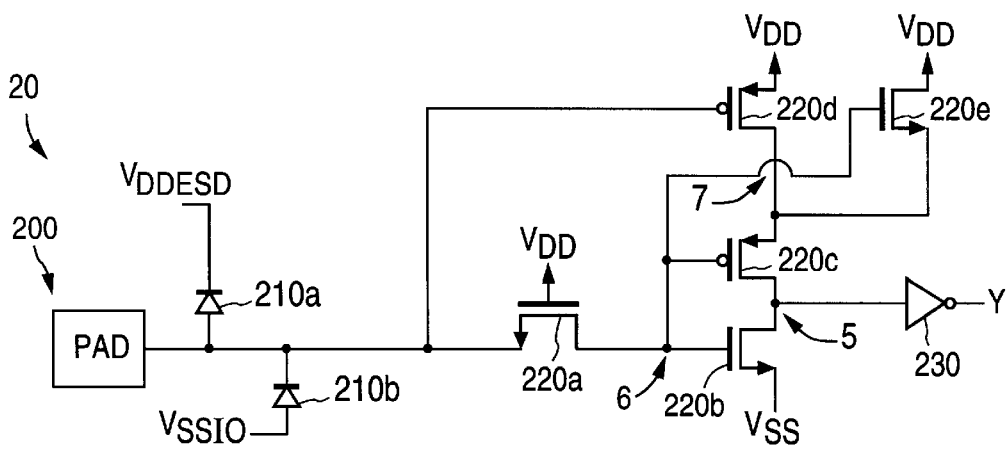
FIG. 2 is an input circuit in accordance with one embodiment of the present invention.

The input circuit 20 of the present invention will now be explained with reference to FIGS. 2–4. FIG. 2 shows an input circuit 20 in accordance with one embodiment of the present invention.

An input pad 200 is connected to the anode of diode 210a. The cathode of diode 210a is connected to a voltage source $V_{DDESD}$.

Another diode 210b has its cathode connected to input pad 200. The anode of diode 210b is connected to a voltage source $V_{SSIO}$.

Briefly, these diodes 210a, 210b serve to protect the circuit 20 from high voltage "spikes," by discharging the extremely high voltage to the "ESD" and "IO" protection circuits (not shown). Therefore, the circuit 20 will not be damaged by these extremely high voltage "spikes."

In the circuit 20, node 5 will have a full voltage range from $V_{DD}$ to 0V. The voltage on node 6 will range between 0V to $V_{DD}-1V_{THN}$. That is, when the input from the pad 200 is HIGH, the source potential of FET 220a will be larger than the gate potential, i.e. $V_{GS}<V_T$, causing the transistor 220a to be OFF (the voltage at node 6 will therefore be $V_{DD}-1V_{THN}$). However, when the pad 200 input is LOW, the source terminal of FET 220a will be at a lower potential than the gate terminal, i.e. $V_{GS}>V_T$, and FET 220a will be ON, thus, the voltage at node 6 will be 0V.

Therefore, as explained above, when the pad 200 input is HIGH, the voltage at node 6 will be HIGH, switching ON transistors 220b and 220e. Therefore, the voltage at node 5 will be 0V and the voltage at node 7 will be charged to $V_{DD}-2V_{THN}$.

When the pad 200 input is LOW, the voltage at node 6 will be LOW and transistor 220c will be switched ON. Furthermore, since the input is LOW, transistor 220d will be switched ON. Thus, the voltage at node 5 will swing to $V_{DD}$. The voltage at node 7 will swing to $V_{DD}$.

Therefore, FET 220a prevents overvoltage on the gate to source terminal voltage of FET 220b by ensuring the largest voltage swing at node 6 will be no greater than $V_{DD}-1V_{THN}$. Furthermore, as described above node 7 is charged up when the pad input 200 is HIGH. Therefore, an overvoltage problem across the gate to drain terminal voltage of FET 220d is avoided. The overvoltage protection circuit is thus provided with an internal overvoltage protection. In other words, not only is the buffer circuit protected from overvoltage stress, but the voltage sensing circuit is configured in a way to protect itself from overvoltage stress. Thus, this circuit solves the overvoltage problem inherent in many input circuits and performs faster than conventional overvoltage protection circuits.

Figure 1A:
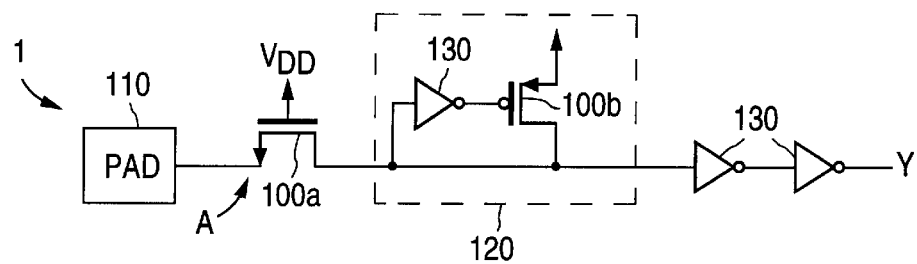
FIG. 1A is a conventional input circuit.
Figure 1B:
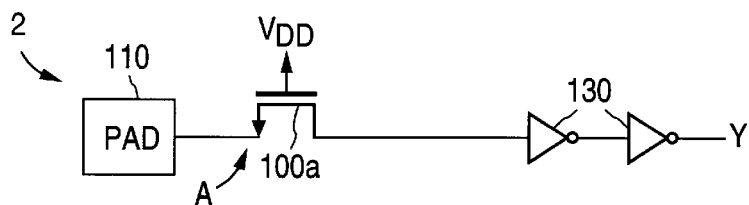
FIG. 1B is another conventional input circuit.
Figure 1C:
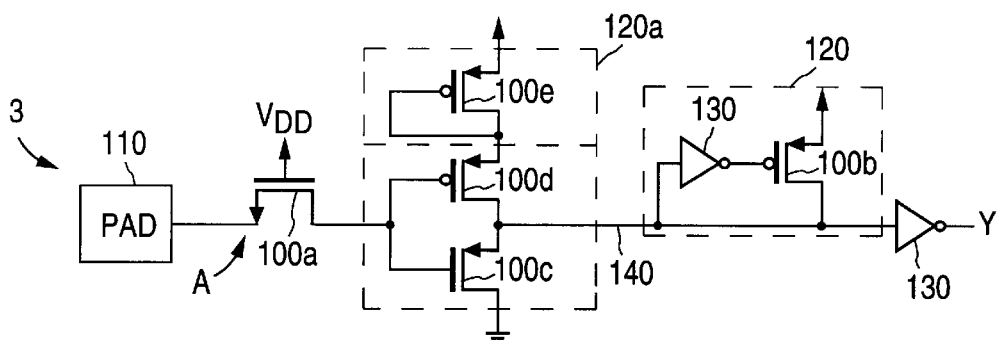
FIG. 1C is yet another conventional input circuit.

For example, referring again to FIGS. 1A and 1C, such conventional circuits inherently have a lot of hysteresis (one-ended hysteresis). As an example, for 3.3V systems, the 0.8V LOW and 2V HIGH voltage magnitudes indicate the voltage magnitudes at which these circuits will interpret a state change.

For example, an input voltage between the ranges of 0.8V and 2V would be interpreted to be that of the previous state. However, any input voltage below 0.8V will be interpreted as a strong logic LOW. Likewise, any input voltage above 2V will be interpreted as a strong logic HIGH. Thus, the propagation times from low-to-high and from high-to-low will have a large amount of skew between them due to this "hysteresis window" (low-to-high of approximately 0.9 ns and high-to-low of approximately 4.5 ns).

Optimal timing would be with near similar propagation times from low-to-high and from high-to-low. As a result of the addition of the voltage sensing circuit component to the circuit of FIG. 2, similar propagation times from low-to-high and from high-to-low, that are partially a function of slow ramp time, can be achieved. Moreover, these times are generally of about half the propagation times from low-to-high and from high-to-low, respectively, of conventional overvoltage circuits.

Thus, the circuit of FIG. 2 solves the overvoltage problem inherent in many input circuits and performs faster than conventional overvoltage protection circuits.

Figure 3:
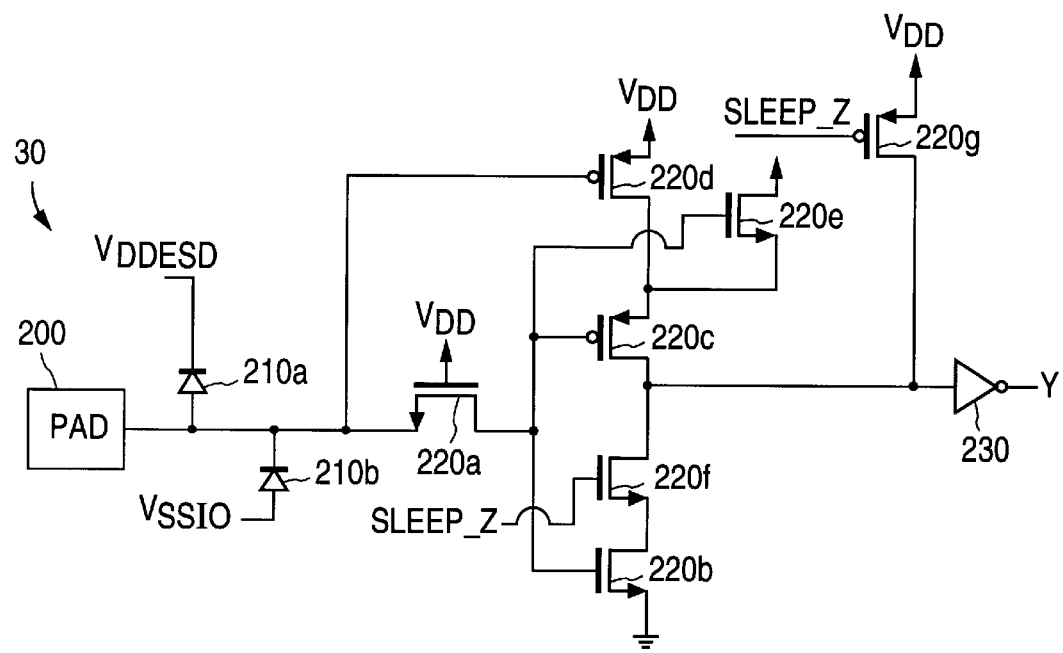
FIG. 3 is an input circuit in accordance with another embodiment of the present invention.

FIG. 3 shows a second embodiment of the input circuit 30 of the present invention with a sleep mode. The sleep mode provides a method of controlling the output of the circuit irrespective of the input. An example of how this is accomplished will be explained later. The differences in circuit structure between the circuits of FIGS. 2 and 3 will now be explained with like components referenced by like reference numbers.

Circuit 30 of FIG. 3 is similar to circuit 20 of FIG. 2 except for the addition of two FETs 220f and 220g. FET 220f is an n-type field effect transistor, whereas FET 220g is a p-type field effect transistor.

FET 220f has its drain terminal connected, in series, to the drain terminal of FET 220c. The source terminal of FET 220f is connected to the drain terminal of FET 220b. The gate terminal of FET 220f is connected to the sleep control signal SLEEP_Z.

FET 220g has its drain terminal connected to the drain terminals of FETs 220c and 220f. The source terminal of FET 220g is connected to a voltage source $V_{DD}$. The gate terminal of FET 220g is connected to the sleep control signal SLEEP_Z.

Operation of the circuit 30 of FIG. 3 is such that the output Y can only be HIGH, i.e. logic level "1," when both pad input 200 is HIGH and SLEEP_Z is HIGH. That is, the input circuit 30 is controlled by SLEEP_Z. For example, if SLEEP_Z is HIGH and pad input 200 is LOW, output Y will be LOW. If SLEEP_Z is HIGH and pad input 200 is HIGH, output Y will be HIGH. If SLEEP_Z is LOW, then regardless of the logic level of pad input 200, output Y will always be LOW.

Figure 4:
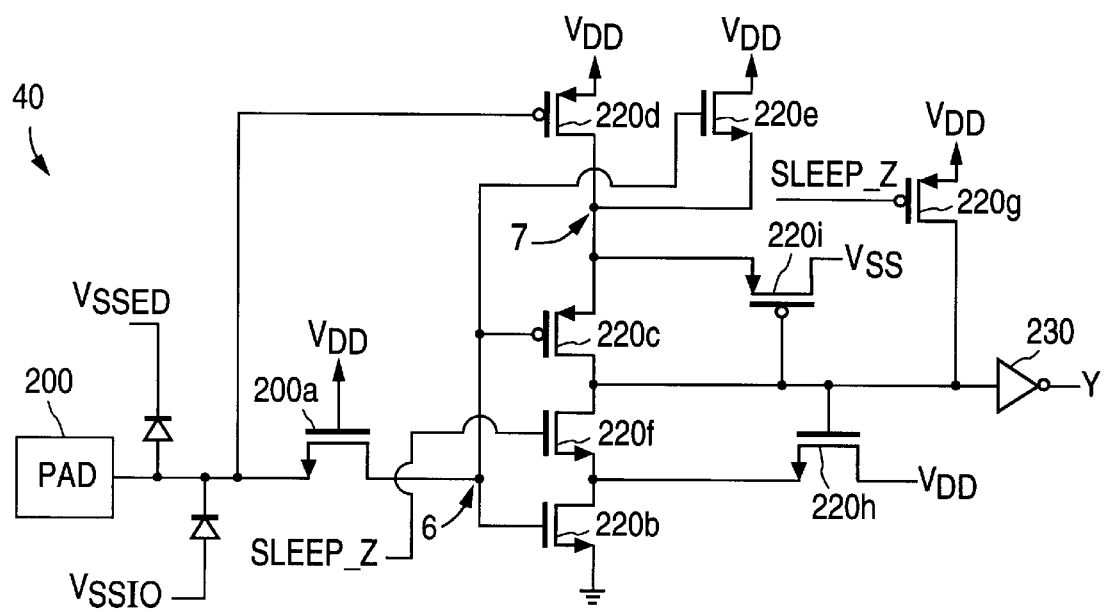
FIG. 4 is an input circuit in accordance with yet another embodiment of the present invention.

FIG. 4 is another embodiment 40 of the input circuit 40 of the present invention with overvoltage protection, sleep mode and hysteresis. The differences in circuit structure between the circuits of FIGS. 2, 3 and 4 will be explained with reference to like components indicated by like reference numbers.

Circuit 40 is similar to the circuit 30 of FIG. 3 except for the addition of two FETs 220h and 220i. FET 220h is an n-type field effect transistor, whereas FET 220i is a p-type field effect transistor.

FET 220h has its source terminal connected to the connection of the source terminal of FET 220f and the drain terminal of FET 220b. The drain terminal of FET 220h is connected to a voltage source $V_{DD}$. The gate terminals of FETs 220h and 220i are connected to node 5. The source terminal of FET 220i is connected to a voltage source $V_{SS}$. The drain terminal of FET 220i is connected to the common node of the source terminals of FETs 220c and 220e and the drain terminal of FET 220d (node 7).

Thus, operation of the circuit of FIG. 4 is as that of the circuit of FIGS. 2 and 3, with the addition of noise tolerance. That is, the hysteresis elements, i.e. FETs 220h and 220i provide a noise tolerance to the circuit.

Typically, the input from the pad 200 will not have "clean" rise and fall times. Instead, these signals will have a "jitter" effect, which is interpreted as noise.

In this circuit, the hysteresis window is approximately 500 mV. Thus, the circuit will interpret an input voltage between the ranges of 1.1V to 1.6V to be that of the previous state. However, any input voltage below 1.1V will be interpreted as a strong logic LOW. Likewise, any input voltage above 1.6V will be interpreted as a strong logic HIGH. It should be noted that these voltage thresholds are merely an example of one embodiment. It is possible to alter both the amount of hysteresis and the absolute high and low thresholds. For example, by resizing transistors 220d, 220c, 220f, 220b, 220i and 220h, the amount of hysteresis can be changed, as well as the actual trip points for a high or low threshold.

Referring again to FIG. 4, depending upon the potential at the output of the inverter (node 5), that potential may be either "high" enough to turn FET 220h ON, or "low" enough to turn FET 220i ON. Since the drain terminal of FET 220h is connected to $V_{DD}$, if the output potential is "high" enough to raise the gate-to-source voltage of FET 220h above the threshold voltage, then FET 220h will turn ON and effectively pull node 5 HIGH very quickly due to $V_{DD}$ being effectively applied to node 5 via FET 220f and FET 220h.

In contrast, since the source terminal of FET 220i is connected to $V_{SS}$, if the output potential is "low" enough to drop the gate-to-source voltage of FET 220i below the threshold voltage, then FET 220i will turn ON and effectively pull node 5 LOW very quickly due to $V_{SS}$ being effectively applied to node 5 via FET 220c and FET 220i.

Thus, a tolerance is introduced in an effort to compensate for noise jitter in the input voltage to produce a desired output logic level.

Figure 5:
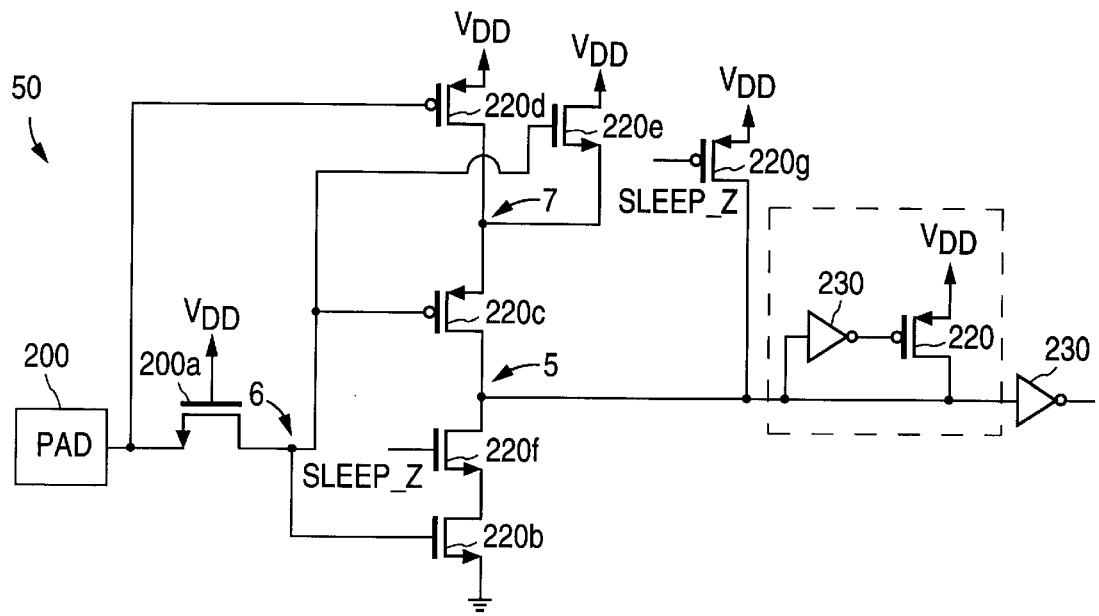
FIG. 5 is an input circuit in accordance with still another embodiment of the present invention.

Whereas the hysteresis circuit components, i.e., FET 220h and FET 220i, of FIG. 4 indirectly affect node 5 through FETs 220f and 220c, respectively, it is possible for the hysteresis circuit components to directly affect node 5, such as is shown in FIG. 5.

Referring now to FIG. 5, in an alternative embodiment shown therein circuit 50 is similar to the circuit 30 of FIG. 3 except for the addition of FET 220j and inverter 230. The source terminal of FET 220j is connected to a voltage source $V_{DD}$. The drain terminal of FET 220j is connected to node 5. An inverter 230 is coupled between the gate terminal of FET 220j and node 5.

Thus, hysteresis will affect the circuit 50, much like described above with respect to the circuit 1 shown in FIG. 1A. However, in the circuit 50 shown in FIG. 5, the hysteresis circuit components, i.e., FET 220j and inverter 230, directly affect node 5 as opposed to the indirect effect on node 5 that occurs in FIG. 4.

Figure 6A:
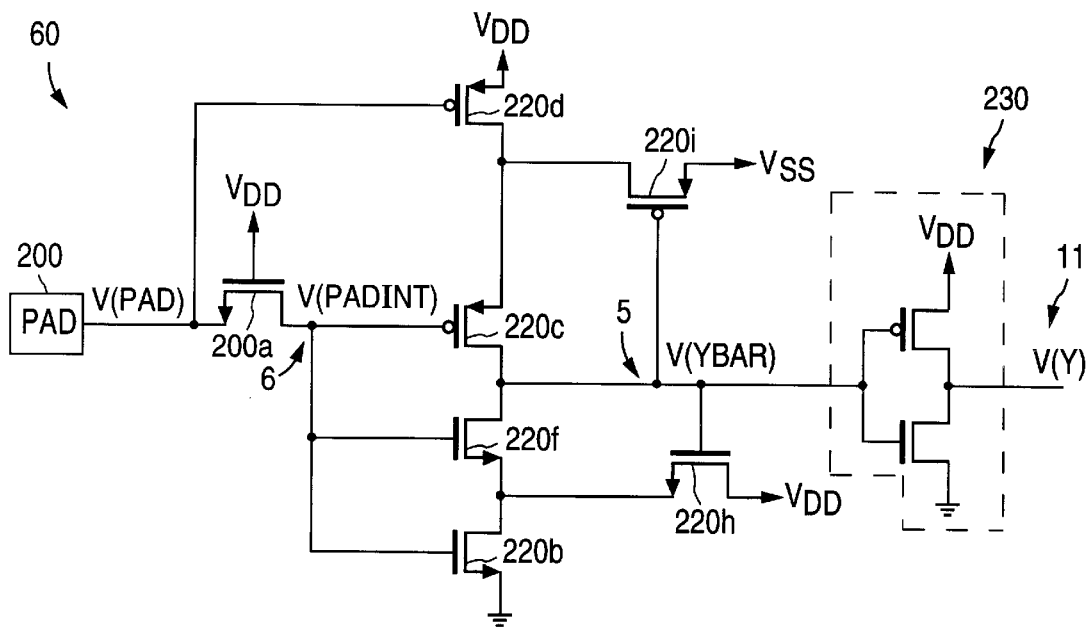
FIG. 6A is an input circuit in accordance with yet still another embodiment of the present invention.
Figure 6B:
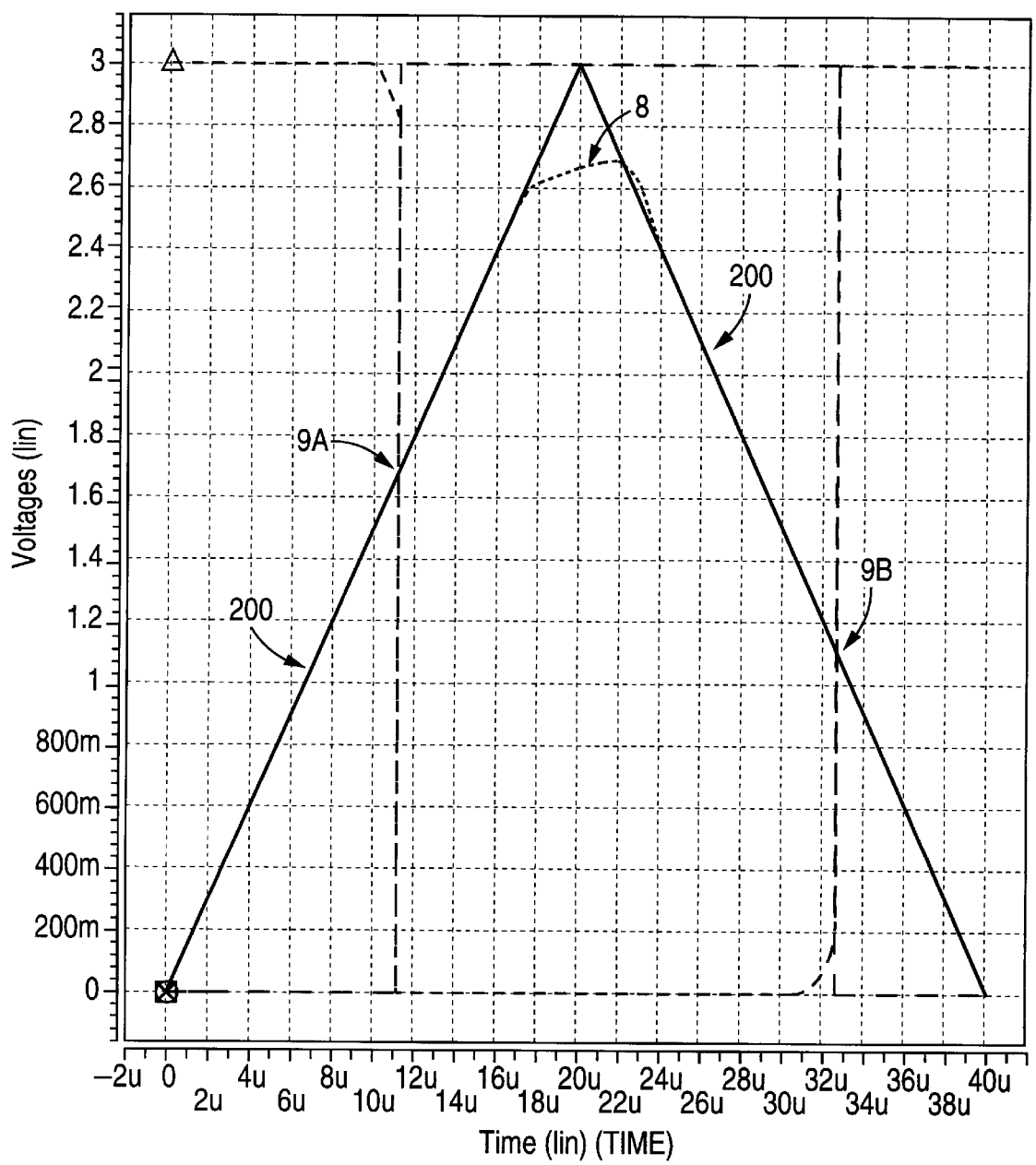
FIG. 6B is a timing diagram of the input circuit of FIG. 6A illustrating the effect of hysteresis on the circuit.

Perhaps the hysteresis effect can be best illustrated by FIGS. 6A and 6B. FIG. 6A illustrates an input circuit according to another embodiment of the invention. Specifically, the circuit 60 shown in FIG. 6A is almost identical to the circuit 40 of FIG. 4, except that FET 220e is absent from the circuit 60 of FIG. 6A, merely for simplification purposes.

FIG. 6B is a graphical representation of certain of the node voltages in FIG. 6A. The three node voltages of interest are V(PAD) (the pad input voltage) 200, output V(Y) 11, and V(YBAR) (represented by node 5 in the Figure). The voltage plot represented in FIG. 6B is a voltage vs. time plot of a simulation of the circuit shown in FIG. 6A. The voltage axis ranges from 0V to 3V and the time axis ranges from 0 s to 4 μs.

Input signal V(PAD) is defined for the particular circuit, and will occur as defined, since it is represented as a perfect voltage source during simulation of the circuit of FIG. 6A. V(PAD) is thus purposely described as a slow ramp, 20 μs rise time and 20 μs fall time, in order to view the actual hysteresis of the circuit. For the particular simulation of the circuit of FIG. 6A, the amount of hysteresis would be 0.53V (1.64V−1.1V=0.53V, measured by the state change voltage potentials) of hysteresis.

Hysteresis usually does not affect the output voltage V(Y) maximum/minimum swing, but it does affect the input voltage required to trigger an output voltage transition.

Therefore, the simulated peak rise time and fall time of the input voltage V(PAD) 200 are nearly identical, peaking at about 20 μs. However, as mentioned above, hysteresis can affect the simulated peak rise and fall times.

As can be seen by reference number 201 (V(YBAR)), hysteresis affects both the maximum amplitude voltage V(PAD) 200 and the peak rise time (shown by the dotted line 8). For example, without hysteresis effects, the simulated peak rise and fall times are nearly identical, approximately 20 μs. With the inclusion of hysteresis effects, as represented by dotted line 201, signal V(PADINT) 8 will equal V(PAD) 200 until V(PAD) 200 rises above $V_{DD}-V_{TH22a}$, at which point V(PADINT) 8 will no longer follow V(PAD) 200, and the simulated peak will occur at the 22 μs point, thereby making the rise time approximately 2 μs slower and the fall time approximately 2 μs faster.

However, hysteresis will not affect the points at which the circuit output will effectively change states. As described above, the circuit will interpret an input voltage between the ranges of 1.1V to 1.6V to be that of the previous state. However, any input voltage below 1.1V will be interpreted as a strong logic LOW. Likewise, any input voltage above 1.6V will be interpreted as a strong logic HIGH. These voltage ranges are indicated in the plot of FIG. 6B as the intersection points 9A and 9B.

Thus, a tolerance is introduced in an effort to compensate for noise jitter in the input voltage to produce a desired output logic level.

Although the above circuit has been described utilizing a connection of field effect transistors, similar results can be obtained by substituting bipolar junction transistors for the respective field effect transistors.

The following examples, recited with reference to the circuit 20 shown in FIG. 2, will better illustrate the benefits and advantages of the fast overvoltage protected input circuit of the present invention. These examples are for illustrative purposes only and in no way are intended to be seen as limiting the invention to their description.

EXAMPLE 1

0.35 micron process

For a 0.35 micron process the maximum voltage $V_{MAX}$ between the gate to drain/source terminals is 4.2V.

In this example, $V_{DD}$ is defined to be 3V and $V_{PAD}$ is defined to be 5.5V. As described above, the voltage on node 6 will range from 0V to $V_{DD}-1V_{THN}$. Therefore, the voltage on node 6 can be characterized as $V_A=V_{DD}-1V_{THN}=3V-0.7V=2.3V$.

The voltage at node 7 will swing from $V_{DD}$ to $V_{DD}-2V_{THN}$. Therefore, the voltage at node 7 can be characterized as $V_B=V_{DD}-2V_{THN}=3V-1.4V=1.6V$. Thus, in this example, for FET 220d, the gate to source voltage $V_{GS}=5.5V-3V=2.5V$, and the gate to drain voltage $V_{GD}=5.5V-1.6V=3.9V$.

Thus, when the pad input voltage is HIGH, FET 220d will be switched OFF. The source potential of FET 220a will be large compared to the gate potential. Therefore, the voltage at node 7 is measured across FETs 220a and 220e, or $2V_{THN}$. Then, $V_B=V_{DD}2V_{THN}=1.6V$ and FET 220d has a gate to drain voltage of $V_{GD}=5.5V-1.6V=3.9V$.

Similarly, for FET 220a, the gate to pad voltage $V_{GS}=5.5V-3V=2.5V$ and the gate to node 6 voltage $V_{GD}=1V_{THN}$.

Therefore, the advantage of these circuits 20, 30, 40 is that no voltage restoring circuit is needed, and therefore, possible conflict between a restoring circuit and a pull-down resistor is eliminated.

When the potential at the input pad 200 swings to a high voltage, the gate terminal of transistor 220d will be sufficiently high to prevent the transistor 220d from being ON when transistor 220b is ON.

For example, if transistors 220e and 220d were removed and the source terminal of transistor 220c was tied to $V_{DD}$, if the input pad 200 is HIGH, transistor 220c would not be completely OFF, while transistor 220b would be ON. This occurs as a result of a self-biasing of transistor 220c. In other words, changes in the biasing of FET 220b cause the drain current of FET 220c to increase or decrease accordingly since this produces corresponding increases or decreases in the gate-to-source voltage of FET 220c which may prevent FET 220c from being completely OFF. For a typical circuit this could result in a 200–500 µA leakage, or "crow bar," current associated with each input. Thus, for a low power application, such as in a portable computer, for a chip with about 450 inputs such leakage would be unacceptable. Hence, with transistors 220d and 220e in place, as shown, this leakage, or "crow bar," current is prevented.

EXAMPLE 2

0.25 micron process

For a 0.25 micron process, the maximum voltage $V_{MAX}$ between the gate to source/drain terminals is about 3.2V.

In this example, voltage $V_{DD}$ is defined to be 2.3V and pad voltage, $V_{PAD}$ is defined to be 3.6V. As described above, the voltage on node 6 will range from 0V to $V_{DD}-1V_{THN}$. Therefore, the voltage on node 6 can be characterized as $V_A=V_{DD}1V_{THN}=2.3V-0.6V=1.7V$. The voltage at node 7 will swing from $V_{DD}$ to $V_{DD}-2V_{THN}$. Therefore, the voltage at node 7 can be characterized as $V_B=V_{DD}-2V_{THN}=2.3V-1.2V=1.1V$.

In this example, for FET 220d, the gate to source voltage $V_{GS}=3.6V-2.3V=1.3V$, and the gate to drain voltage $V_{GD}=3.6V-1.1V=2.5V$. That is, when the pad input voltage is HIGH, FETs 220c and 220d are switched OFF. Therefore, the voltage at node 7 is measured across FETs 220a and 220e, or $2V_{THN}$. Then, $V_B=V_{DD}-2V=1.1V$, and FET 220d has a gate to drain voltage of $V_{GD}=3.6V-1.1V=2.5V$.

Similarly, for FET 220a, the gate to pad voltage $V_{GS}=3.6V-2.3V=1.3V$, and the gate to node 6 voltage $V_{GD}=1V_{THN}$.

Therefore, the advantage of these circuits 20, 30, 40 is that no voltage restoring circuit is needed, and therefore, possible conflict between a restoring circuit and a pull-down resistor is eliminated. Similar to the example directed to the 0.35 micron process, no leakage, or "crow-bar," current will occur in this example, and the speed through the circuit will be faster than prior art circuits since the propagation times from high-to-low and from low-to-high are nearly equal.

It should be noted in each of these examples, that since current can flow in the subthreshold condition, if a voltage higher than the voltage on the gate terminal of transistor 220a is placed on the PAD 200 for a long period of time, the voltage on the PADINT node 6 will approach the $V_{DD}$ voltage placed on the gate terminal of transistor 220a.

In this disclosure, there is shown and described a preferred embodiment of the invention, but, as also mentioned, it is to be understood that the invention is capable of use in various other combinations and environments and is capable of changes or modifications within the scope of the inventive concept as expressed herein.

What is claimed is:

1. An apparatus, including an overvoltage protection circuit, comprising:
   an input terminal configured to convey an input voltage;
   an output terminal configured to convey an output voltage;
   a buffer circuit including a plurality of buffer circuit terminals coupled between said input terminal and said output terminal, configured to receive and buffer said input voltage and in accordance therewith provide said output voltage;
   a voltage sensing circuit, coupled to said input terminal and said buffer circuit, configured to sense said input voltage and in accordance therewith maintain a plurality of voltages at said plurality of buffer circuit terminals of said buffer circuit in a corresponding predetermined plurality of voltage ranges; and
   a control circuit, coupled to said buffer circuit, configured to receive at least one control signal and in accordance therewith causes said output voltage to be maintained at the predetermined value irrespective of said input voltage.

2. The apparatus of claim 1, wherein said overvoltage protection circuit further includes an internal terminal, and wherein said voltage sensing circuit is further configured to sense said input voltage and in accordance therewith maintain a voltage at said internal terminal in a predetermined voltage range.

3. The apparatus of claim 1, wherein said buffer circuit is a CMOS inverter.

4. The apparatus of claim 1, wherein said buffer circuit includes a plurality of field effect transistors.

5. The apparatus of claim 1, wherein said voltage sensing circuit includes a plurality of field effect transistors.

6. The apparatus of claim 1, wherein said control circuit includes a plurality of field effect transistors.

7. The apparatus of claim 1 further comprising another voltage sensing circuit, coupled to said buffer circuit, configured to sense said output voltage and in accordance therewith provide first and second bias voltages to said buffer circuit, wherein:
said output voltage includes
minimum and maximum voltage values,
a lower voltage threshold between said minimum and maximum voltage values,
a higher voltage threshold between said lower voltage threshold and said maximum voltage value,
a lower range of values between said minimum voltage value and said lower voltage threshold, and
a higher range of values between said higher voltage threshold and said maximum voltage value; and
in accordance with said first and second bias voltages, said buffer circuit provides said output voltage with a value which becomes
equal to said maximum voltage value after said output voltage has transitioned from said lower range of values past said lower and higher voltage thresholds successively, and
equal to said minimum voltage value after said output voltage has transitioned from said higher range of values past said higher and lower voltage thresholds successively.

8. An apparatus, including an overvoltage protection circuit, comprising:
an input terminal configured to convey an input voltage;
an output terminal configured to convey an output voltage;
a buffer circuit including a plurality of buffer circuit terminals coupled between said input terminal and said output terminal, configured to receive and buffer said input voltage and in accordance therewith provide said output voltage;
a voltage sensing circuit, coupled to said input terminal and said buffer circuit, configured to sense said input voltage and in accordance therewith maintain a plurality of voltages at said plurality of terminals of said buffer circuit in a corresponding predetermined plurality of voltage ranges;
a control circuit, coupled to said buffer circuit, configured to receive at least one control signal and in accordance therewith causes said output voltage to be maintained at a predetermined value irrespective of said input voltage; and
another voltage sensing circuit, coupled to said buffer circuit, configured to sense said output voltage and in accordance therewith provide first and second bias voltages to said buffer circuit, wherein:
said output voltage includes
minimum and maximum voltage values,
a lower voltage threshold between said minimum and maximum voltage values,
a higher voltage threshold between said lower voltage threshold and said maximum voltage value,
a lower range of values between said minimum voltage value and said lower voltage threshold, and
a higher range of values between said higher voltage threshold and said maximum voltage value; and
in accordance with said first and second bias voltages, said buffer circuit provides said output voltage with a value which becomes
equal to said maximum voltage value after said output voltage has transitioned from said lower range of values past said lower and higher voltage thresholds successively, and
equal to said minimum voltage value after said output voltage has transitioned from said higher range of values past said higher and lower voltage thresholds successively.

9. The apparatus of claim 8, wherein said overvoltage protection circuit further includes an internal terminal, and wherein said voltage sensing circuit is further configured to sense said input voltage and in accordance therewith maintain a voltage at said internal terminal in a predetermined voltage range.

10. The apparatus of claim 8, wherein said buffer circuit is a CMOS inverter.

11. The apparatus of claim 8, wherein said buffer circuit includes a plurality of field effect transistors.

12. The apparatus of claim 8, wherein said voltage sensing circuit includes a plurality of field effect transistors.

13. The apparatus of claim 8, wherein said control circuit includes a plurality of field effect transistors.

14. The apparatus of claim 8, wherein said another voltage sensing circuit includes a plurality of field effect transistors.

15. An apparatus, including an overvoltage protection circuit, comprising:
an input terminal configured to convey an input voltage;
an output terminal configured to convey an output voltage;
a telescopically connected group of field effect transistors, coupled between said input terminal and said output terminal, said group including a CMOS inverter and a p-type load transistor, the gate terminal of said p-type load transistor coupled to said input terminal and the drain terminal of said p-type load transistor coupled to a first voltage source, said p-type load transistor and said CMOS inverter having a common node;
a first field effect transistor, the source terminal of said first field effect transistor coupled to said input terminal and the drain terminal of said first field effect transistor coupled to the gate terminals of said CMOS inverter, the gate terminal of said first field effect transistor coupled to said first voltage source; and
a second field effect transistor, the source terminal of said second field effect transistor coupled to said common node and the drain terminal of said second field effect transistor coupled to said first voltage source, the gate terminal of said second field effect transistor coupled to the drain terminal of said first field effect transistor.

16. The apparatus of claim 15, wherein said first field effect transistor and said second field effect transistor are each NMOS.

17. An apparatus, including an overvoltage protection circuit, comprising:
an input terminal configured to convey an input voltage;
an output terminal configured to convey an output voltage;
a telescopically connected group of field effect transistors, coupled between said input terminal and said output terminal, said group including a CMOS inverter, formed of an n-type transistor and a p-type transistor, a p-type load transistor, and an additional n-type transistor, the gate terminal of said p-type load transistor coupled to said input terminal and the drain terminal of said p-type load transistor coupled to a first voltage source, said p-type load transistor and said CMOS inverter having a common node, and the drain terminal of said additional n-type transistor coupled to the drain terminal of said p-type transistor of said CMOS inverter, the source terminal of said additional n-type transistor coupled to the drain terminal of said n-type transistor of said CMOS inverter, the gate terminal of said additional n-type transistor configured to receive a control signal;

a first field effect transistor, the source terminal of said first field effect transistor coupled to said input terminal and the drain terminal of said first field effect transistor coupled to the gate terminals of said CMOS inverter, the gate terminal of said first field effect transistor coupled to said first voltage source; and a second field effect transistor, the source terminal of said second field effect transistor coupled to said common node and the drain terminal of said second field effect transistor coupled to said first voltage source, the gate terminal of said second field effect transistor coupled to the drain terminal of said first field effect transistor; and a third field effect transistor, the drain terminal of said third field effect transistor coupled to said CMOS inverter and the source terminal of said third field effect transistor coupled to said first voltage source, the gate terminal of said third field effect transistor configured to receive another control signal.

18. The apparatus of claim 17, wherein said first field effect transistor and said second field effect transistor are each NMOS and wherein said third field effect transistor is PMOS.

19. An apparatus, including an overvoltage protection circuit, comprising:

an input terminal configured to convey an input voltage;

an output terminal configured to convey an output voltage;

a telescopically connected group of field effect transistors, coupled between said input terminal and said output terminal, said group including a CMOS inverter, formed of an n-type transistor and a p-type transistor, a p-type load transistor, and an additional n-type transistor, the gate terminal of said p-type load transistor coupled to said input terminal and the drain terminal of said p-type load transistor coupled to a first voltage source, said p-type load transistor and said CMOS inverter having a common node, and the drain terminal of said additional n-type transistor coupled to the drain terminal of said p-type transistor of said CMOS inverter, the source terminal of said additional n-type transistor coupled to the drain terminal of said n-type transistor of said CMOS inverter, the gate terminal of said additional n-type transistor configured to receive a control signal;

a first field effect transistor, the source terminal of said first field effect transistor coupled to said input terminal and the drain terminal of said first field effect transistor coupled to the gate terminals of said CMOS inverter, the gate terminal of said first field effect transistor coupled to said first voltage source; and second field effect transistor, the source terminal of said second field effect transistor coupled to said common node and the drain terminal of said second field effect transistor coupled to said first voltage source, the gate terminal of said second field effect transistor coupled to the drain terminal of said first field effect transistor;

a third field effect transistor, the drain terminal of said third field effect transistor coupled to said CMOS inverter and the source terminal of said third field effect transistor coupled to said first voltage source, the gate terminal of said third field effect transistor configured to receive another control signal;

a fourth field effect transistor, the source terminal of said fourth field effect transistor coupled to said common node and the drain terminal of said fourth field effect transistor coupled to a second voltage source, the gate terminal of said fourth field effect transistor coupled to said output terminal; and a fifth field effect transistor, the source terminal of said fifth field effect transistor coupled to the source terminal of said additional n-type transistor and the drain terminal of said fifth field effect transistor coupled to said first voltage source, the gate terminal of said fifth field effect transistor coupled to said output terminal.

20. The apparatus of claim 19, wherein said first field effect transistor, said second field effect transistor, and said fifth field effect transistor are each NMOS and wherein said third field effect transistor and said fourth field effect transistor are each PMOS.

* * * * *